United States Patent
McCafferty et al.

(10) Patent No.: US 9,165,571 B2
(45) Date of Patent: Oct. 20, 2015

(54) MAGNETIC STACK COUPLING BUFFER LAYER

(71) Applicant: Seagate Technology LLC, Cupertino, CA (US)

(72) Inventors: Gabriel G. McCafferty, Londonderry (GB); Sameh Sayed Ali Hassan, Londonderry (GB); Marcus Ormston, Londonderry (GB); Kevin A. McNeill, Londonderry (GB)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/076,696

(22) Filed: Nov. 11, 2013

(65) Prior Publication Data

US 2015/0131182 A1      May 14, 2015

(51) Int. Cl.
*G11B 5/39* (2006.01)
*G11B 5/235* (2006.01)

(52) U.S. Cl.
CPC ............... *G11B 5/235* (2013.01); *G11B 5/3903* (2013.01); *G11B 5/3929* (2013.01)

(58) Field of Classification Search
CPC ............ G11B 5/127; G11B 5/33; G11B 5/39; G11B 5/3903; G11B 5/3906; G11B 5/3912
USPC ............ 360/319, 324, 324.1, 324.11, 324.12, 360/324.2, 110, 320
See application file for complete search history.

(56) References Cited

U.S. PATENT DOCUMENTS

| | | | |
|---|---|---|---|
| 7,112,375 B2 | 9/2006 | Marinero et al. | |
| 7,145,755 B2 | 12/2006 | Freitag et al. | |
| 7,352,543 B2 | 4/2008 | Li et al. | |
| 7,355,823 B2 | 4/2008 | Li et al. | |
| 7,483,246 B2 | 1/2009 | Pinarbasi | |
| 8,164,862 B2 | 4/2012 | Zhang et al. | |
| 8,390,956 B2 * | 3/2013 | Tonooka et al. | 360/135 |
| 8,743,507 B1 * | 6/2014 | Hassan et al. | 360/125.3 |
| 2002/0044393 A1 * | 4/2002 | Seigler et al. | 360/324 |
| 2007/0127166 A1 | 6/2007 | Kamai et al. | |
| 2009/0103215 A1 * | 4/2009 | Freitag et al. | 360/324.12 |
| 2009/0251829 A1 * | 10/2009 | Zhang et al. | 360/319 |
| 2010/0128400 A1 * | 5/2010 | Lin | 360/319 |
| 2011/0298456 A1 * | 12/2011 | Lu et al. | 324/252 |
| 2012/0069472 A1 * | 3/2012 | Lin | 360/123.37 |
| 2013/0164562 A1 * | 6/2013 | Lin | 428/811.1 |
| 2013/0230741 A1 | 9/2013 | Wang et al. | |

FOREIGN PATENT DOCUMENTS

WO      WO2012082998 A1      6/2012

* cited by examiner

*Primary Examiner* — Jefferson Evans
(74) *Attorney, Agent, or Firm* — Hall Estill Attorneys at Law

(57) ABSTRACT

A data storage system may be configured at least with a seed lamination that is disposed between a magnetic stack and a magnetic shield. The seed lamination may be constructed and operated with a coupling buffer layer and a seed layer with the coupling buffer layer fabricated of an alloy of cobalt and a transition metal.

20 Claims, 4 Drawing Sheets

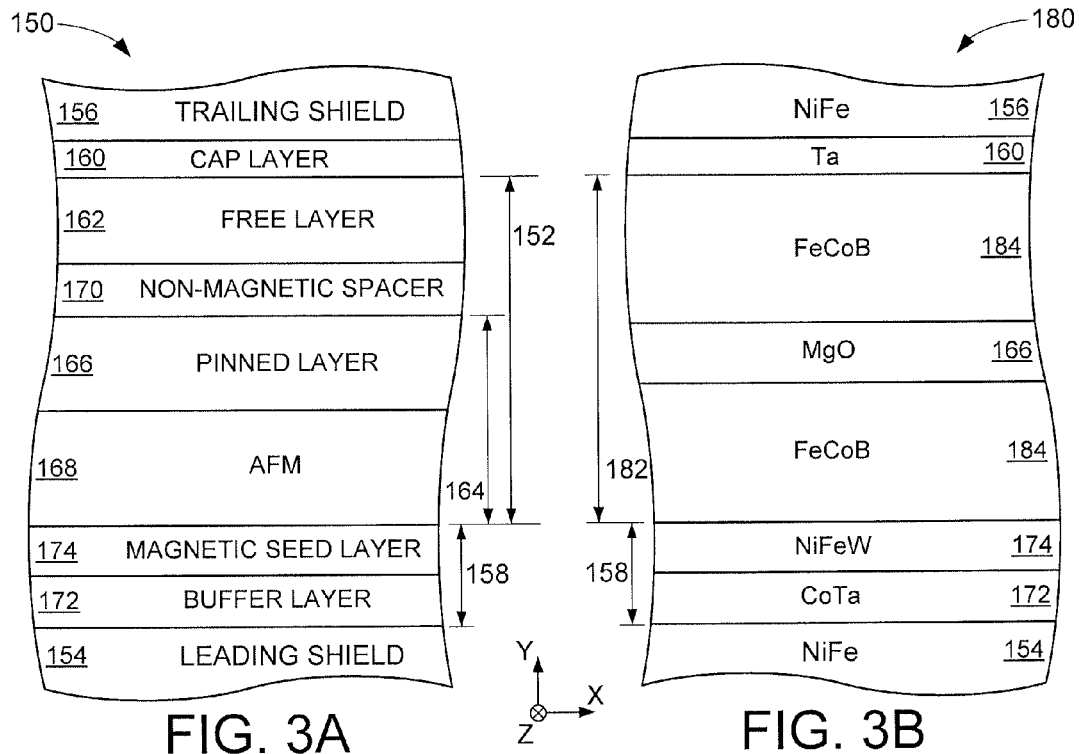
FIG. 3A
FIG. 3B
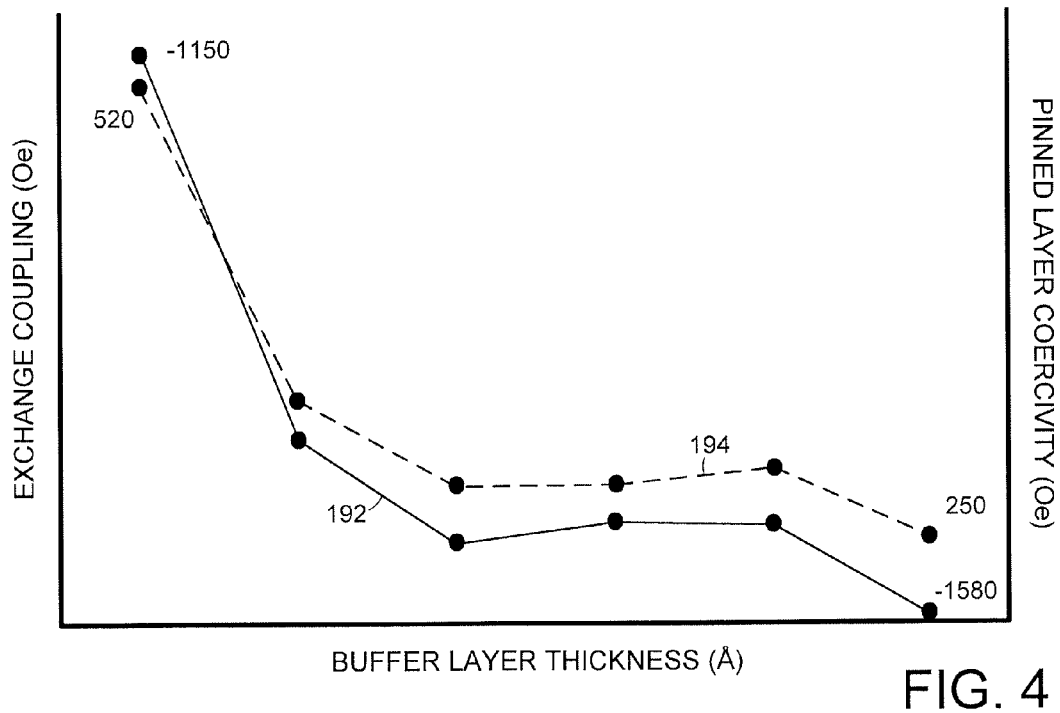
FIG. 4

MAGNETIC STACK COUPLING BUFFER LAYER

SUMMARY

Assorted embodiments may configure a data storage system with at least a seed lamination that is disposed between a magnetic stack and a magnetic shield. The seed lamination may be constructed and operated with a coupling buffer layer and a seed layer with the coupling buffer layer fabricated of an alloy of cobalt and a transition metal.

BRIEF DESCRIPTION OF THE DRAWINGS

FIGS. 3A and 3B respectively display block representations of portions of an example magnetic elements configured in accordance with various embodiments.

FIG. 4 plots operational data corresponding to an example data reader constructed and operated in accordance with some embodiments.

DETAILED DESCRIPTION

Data storage systems have continually reduced in size while increasing in data storage capacity to meet consumer demand for mobile computing devices with greater data processing and storage capabilities. Such capabilities can be facilitated, at least in part, by minimizing the physical dimensions of data storage components, like data transducing readers and writers, in combination with more densely packing data bits on a rotating data storage medium. However, shrinking the physical size of data storage components can result in unintended magnetic operation, such as magnetic layers coupling inadvertently instead of in accordance with predetermined design. Hence, industry and consumer demand pushes for data storage components with reliable magnetic operation despite decreased physical dimensions.

Accordingly, a data storage system may be configured with a seed lamination disposed between a magnetic stack and a magnetic shield with the seed lamination having a seed layer and a coupling buffer layer composed of an alloy of cobalt and a transition metal. The utilization of a magnetic coupling layer can provide optimized magnetic coupling and stabilization in reduced form factor data storage devices. The ability to tune the construction of the magnetic coupling buffer layer for thickness and material can promote stable magnetic coupling between predetermined aspects of a data storage component without adding functional size to the magnetic stack.

Figure 1:
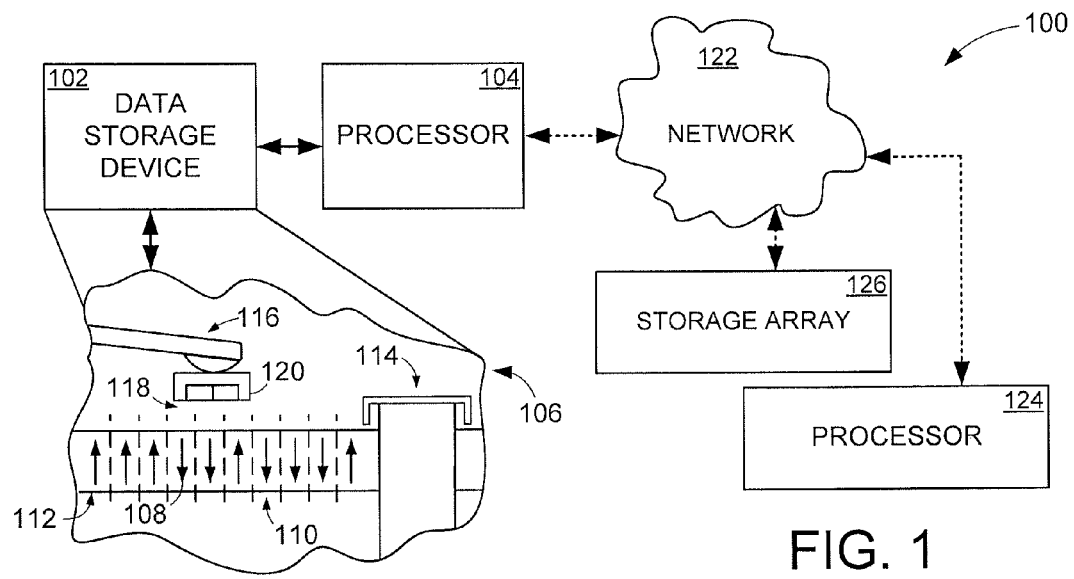
FIG. 1 is a block representation of a portion of an example data storage system configured in accordance with some embodiments.

FIG. 1 generally illustrates a non-limiting example data storage system 100 constructed and operated in accordance with various embodiments to employ a tuned seed lamination. The data storage system 100 may have one or more data storage devices 102, such as a hard disk drive, hybrid drive, and solid-state drive, which operate individually and collectively, as dictated by a controller 104.

While the data storage device 102 is not limited to a particular type of data storage, FIG. 1 displays a portion of an example rotating data storage environment 106 where magnetic data bits 108 are organized in data tracks 110 on a data storage medium 112. Through controlled rotation of the data storage medium 112 via a central spindle motor 114, an actuating assembly 116 can float on an air bearing 118 to allow one or more data transducing means, such as a data bit sensor or writer, residing individually or together on a suspended transducing head 120 to access selected data bits 108.

The rotating data storage environment 106 may be used exclusively to service data storage requests at any time. Various embodiments allow the data storage device 102 to be accessed by a remote host 122 and supplemented by at least one remote storage array 124 via a network 126. Such remote access and additional data storage capabilities can provide sophisticated data caching and processing that can optimize the data capacity and efficiency of the local data storage device 102. For example, high data storage volume conditions may trigger the local processor 104 to send pending data requests to the remote storage array 124 until a convenient time for the actuating assembly 116 to service the data requests. In another non-limiting example, the remote host 122 may operate in concert with the local processor 104 to remap and distribute data amongst several different data storage devices 102.

Figure 2:
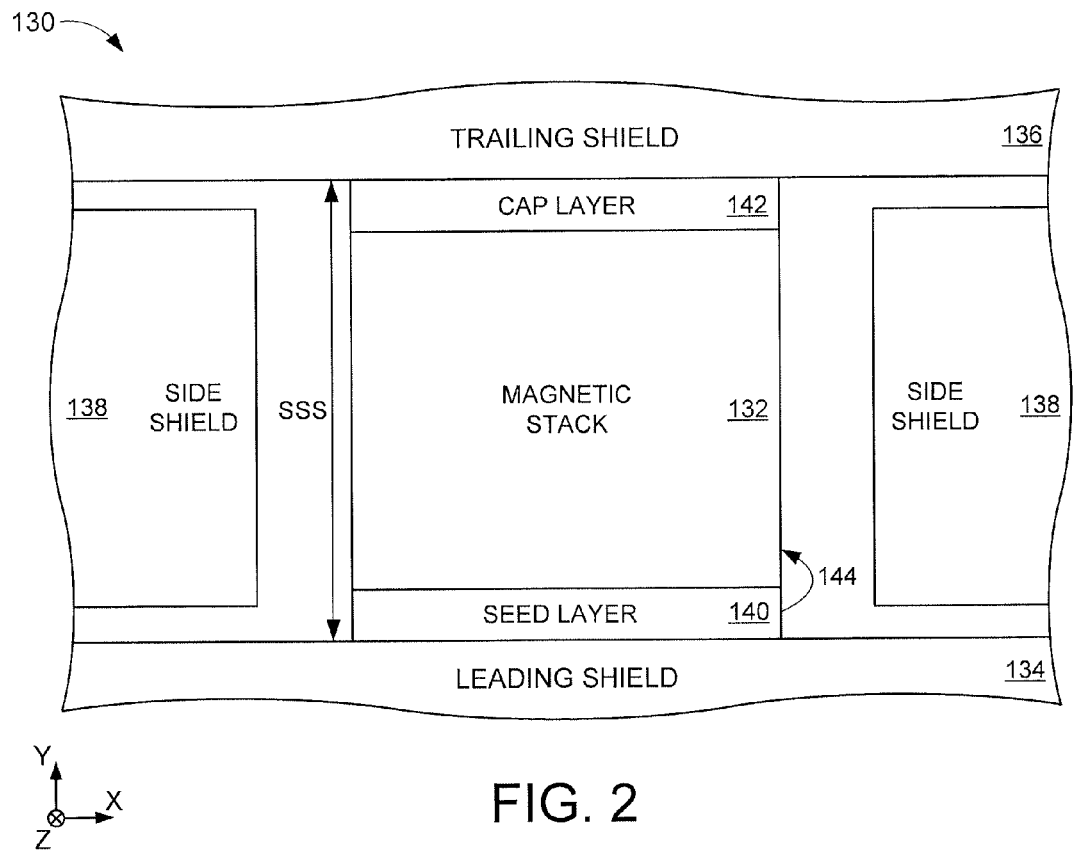
FIG. 2 shows an ABS view block representation of a portion an example data sensor capable of being used in the data storage system of FIG. 1.

As the data bits 108 are more densely packed on the data storage medium 112, the data storage capacity of the data storage device 102 is increased, but the precision with which the transducing head 120 can accurately access a selected data bit 108 is emphasized. FIG. 2 displays an air bearing surface (ABS) block representation of a portion of an example data sensor 130 capable of being used in the transducing head 120 in accordance with some embodiments. The data sensor 130 can have a magnetic stack 132 that is sensitive to encountered data bits and can register a predetermined response to those encountered data bits that is distinguishable as a logical state.

An increase in data bit areal density on a data storage medium can make magnetic stack 132 sensing of individual data bits difficult without magnetic shields strategically positioned to define the magnetic extent of the magnetic stack 132 to read a predetermined number of data bits, such as a single data bit or multiple concurrent data bits in two dimensional magnetic recordings. Magnetic shields can be constructed and configured in an unlimited variety of arrangements, but can be characterized as leading 134, trailing 136, and side 138 shields in some embodiments in response to their respective positions to the magnetic stack 132 in relation to a data track of an adjacent data storage medium. That is, the leading shield 134 can encounter a data bit before the magnetic stack 132 due to its down-track relation to the magnetic stack 132 while the side shields 138 are laterally positioned on opposite sides of the magnetic stack 132 along the X axis.

While the position and construction of the various magnetic shields can promote accurate sensing of data bits in high areal bit density environments, minimization of the physical dimensions of the magnetic stack 132 in an effort to reduce the shield-to-shield spacing (SSS) can result in unintended consequences that can jeopardize accuracy and performance of the data sensor 130. For example, shrinking the physical size of the magnetic stack 132, and its constituent magnetic layers, can magnetically couple one or more of the shields to the magnetic stack 132, which can inadvertently taint the magnetic stack's response to encountered data bits.

Magnetic seed 140 and cap 142 layers can decrease SSS while enhancing data bit sensing performance by narrowing the data sensing pulse width (PW50). A magnetic seed 140, for instance, can be configured as a bilayer of magnetic and non-magnetic sub-layers that provide a good growth structure for the magnetic stack 132 and couple to the leading shield 134. However, it has been found that the non-magnetic seed sub-layer effectively decouples the leading shield 134 from the magnetic seed sub-layer and promotes the seed layer 140 coupling with the magnetic stack 132, as shown by solid line 144, which induces instability that threatens magnetic stack 132 accuracy and efficiency.

With these structural and operational challenges in mind, a seed and cap layer that promotes coupling with an adjacent magnetic shield instead of the magnetic stack 132 in a reduced form factor data storage environment is a continued industry and consumer goal. FIGS. 3A and 3B respectively show ABS view block representations of portions of example magnetic elements 150 and 180 that can each be configured in accordance with assorted embodiments to be used in the data storage system 100 of FIG. 1.

FIG. 3A displays a magnetic element 150 with a magnetic stack 152 disposed vertically between leading 154 and trailing 156 shields as well as between seed 158 and cap 160 structures. The magnetic stack 152 can be characterized as an abutted junction data sensor having a magnetically free layer 162 and a fixed magnetization structure 164 comprising a ferromagnetic pinned layer 166 that is set to a predetermined magnetic state by an antiferromagnetic (AFM) layer 168. The comparison of the fixed magnetization of the fixed magnetization structure 164 with the free layer's response to an encountered data bit can be read as a logical state across the non-magnetic spacer layer 170.

The magnetization of the fixed magnetization structure 164 can be increasingly volatile with decreasing layer thicknesses parallel to the ABS. Accordingly, the seed structure 158 can be configured with a buffer layer 172 disposed between a magnetic seed layer 174 and the leading shield 154. While not shown in FIG. 3A, the trailing shield 156 may also be constructed atop the cap layer 160 that has one or more constituent sub-layers that may be similar or dissimilar from the buffer 172 and seed 174 layers of the seed structure 158. The tuned construction of the buffer layer 172 and magnetic seed layer 174 can provide a predetermined texture and substrate to grow the AFM layer 168 with stable magnetic properties, despite a reduced physical size. However, the use of magnetic material in the seed structure 158 can also be volatile and inadvertently couple with the AFM 168 instead of the leading shield 154 when the buffer layer 172 is constructed of a non-magnetic material like ruthenium or tantalum.

Such unwanted magnetic coupling with the AFM 168 can alter the magnetization of the fixed magnetization structure 164 and consequently the sensing of data bits in concert with the free layer 162. That is, even with a non-magnetic buffer layer 170, like Ta or Ru, the magnetic seed layer 174 can induce magnetic element 150 instability with degraded performance by coupling with the AFM 168. The example magnetic element 180 of FIG. 3B illustrates how tuned material selection can optimize the structure and operation of the seed structure 158 by providing a good growth substrate and promoting magnetic coupling between the magnetic seed layer 174 and the leading shield 154. It should be noted that while the various magnetic element 180 layers are shown as selected materials, such materials are not required or limiting and can be modified in accordance with various embodiments.

The magnetic element 180 is configured with a trilayer magnetic stack 182 that has dual magnetically free layers 184 on opposite sides of the non-magnetic spacer layer. The absence of the fixed magnetization structure 164 can allow the magnetic element 180 to have a smaller SSS as biasing magnetic structures are moved away from the ABS. In yet, removal of the fixed magnetization structure 164 can result in greater volatility in the event the NiFeW alloy magnetic seed layer 174 couples with the FeCoB free layer 184. Construction of the buffer layer 172 of amorphous $Co_XTa_{1-X}$ where X is between 15-40 atomic % can promote magnetic coupling between the magnetic seed layer 174 and the NiFe leading shield 154.

It should be noted that the CoTa alloy buffer layer 172 construction is not limiting as various embodiments configured the buffer layer 172 configured as a cobalt and transition metal alloy, such as CoZr, CoHf, CoNb, CoW, CoTi, and CoMo, which can similarly optimize magnetic stack performance regardless of the type of magnetic stack. It has been found that the use of the magnetic cobalt and transition metal alloy buffer layer 172 is particularly useful for abutted junction magnetic elements, like the element 180 of FIG. 3A as the buffer layer 172 maintains strong exchange coupling between the AFM 168 and pinned layer 166 while providing a substrate conducive to reliable AFM 168 material growth, such as IrMnCr.

FIG. 4 plots operational data from an example data sensor constructed with an abutted junction magnetic stack, a CoTa buffer layer, and a NiFeW magnetic seed layer in accordance with various embodiments. The solid line 192 ranges from −1150 to −1580 Oe and corresponds to the amount of exchange coupling experienced between the AFM and pinned layers of the magnetic stack as a function of the CoTa thickness in Angstroms. The variation of the negative exchange coupling can be associated with the amount of pinned layer magnetic coercivity displayed by segmented line 194 through the use of buffer layers having different thicknesses, as measured parallel to the ABS on the ABS.

In other words, the use of a buffer layer with a tuned thickness, such as 15 Å, can provide a predetermined negative exchange coupling, like −1150 Oe, between the AFM and pinned layer along with a predetermined pinned layer magnetic coercivity that ranges between 520 and 250 Oe. The example operational data of FIG. 4 illustrates how tuned construction of the buffer layer portion of a seed structure can optimize exchange coupling and magnetic coercivity by decreasing the intermixing of layer materials that can result in a "dead layer" where poor lattice matching occurred during layer growth, which is particularly present when tantalum is deposited atop a NiFe leading shield.

It can be appreciated that the tuned construction of a buffer layer can provide optimized magnetic properties that complement the low magnetic coercivity, low negative magnetostriction, high crystallization temperature, and good thermal stability of the CoTa alloy material. The fact that CoTa material is magnetic further optimizes magnetic data bit sensing as the seed structure acts as part of the leading shield and its thickness has no impact on the SSS of the magnetic element. The optimization of a magnetic element is not limited to the CoTa material as other cobalt and transition metal alloys can provide differing magnetic, thermal, and crystalline characteristics that allow the seed structure to be optimized for a diverse variety of magnetic element and data storage environments.

Figure 5:
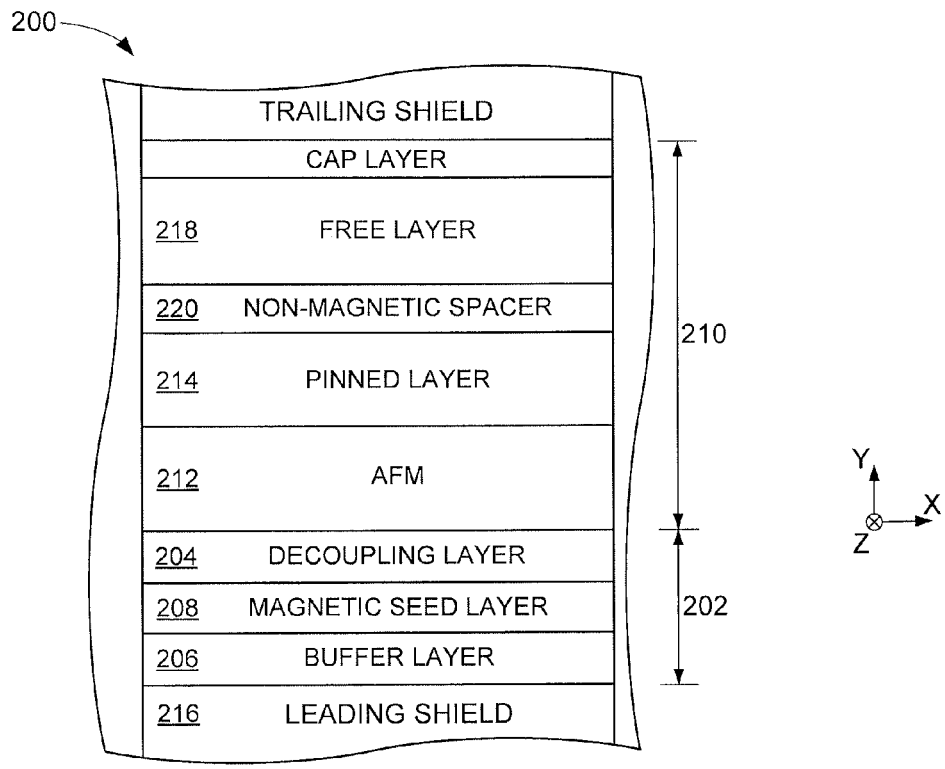
FIG. 5 shows an ABS view block representations of a portion of an example data sensor configured in accordance with assorted embodiments.

While the tuned material and thickness of a seed structure buffer layer can be used to promote coupling between the magnetic seed layer and the adjacent magnetic shield, such coupling may further be promoted by positioning a decoupling layer between the magnetic stack and magnetic seed layer. FIG. 5 generally shows an ABS view block representation of a portion of an example data sensor 200 configured with a seed structure 202 having a decoupling layer 204 in accordance with some embodiments. Much like the buffer layer 206 and magnetic seed layer 208 of the seed structure 202, the decoupling layer 204 can be tuned for material and thickness along the Y axis to provide optimized magnetic structure and operation in the magnetic stack 210.

In a non-limiting embodiment, the decoupling layer 204 is constructed of a non-magnetic material, such as tantalum, ruthenium, or alloys of the like, that increases the pinning magnetic field between the AFM 212 and pinned layer 214 of the magnetic stack 210 while promoting magnetic coupling between the magnetic seed layer 208 and the leading shield 216. The increased pinning magnetic field of the pinned layer 214 can optimize data sensor 200 performance by strengthening the stack's 210 stability and resistance to encountered magnetic fields, which can increase the accuracy and efficiency of free layer 218 response and data reading across the non-magnetic spacer 220. Through the tuned construction of the decoupling layer 204, the pinning field in the magnetic stack 210 and the performance of the data sensor 200. However, the decoupling layer 204 is not required to optimize the pinning field in the magnetic stack 210.

Figure 6:
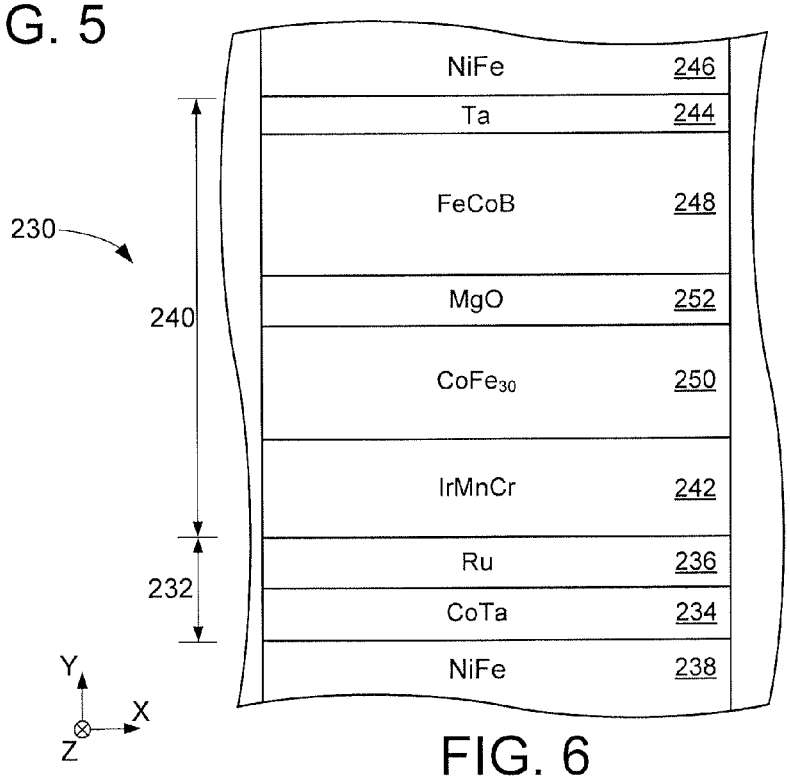
FIG. 6 illustrates an ABS view block representation of an example magnetic element constructed and operated in accordance with some embodiments.

FIG. 6 illustrates an ABS view block representation of a portion of an example magnetic element 230 constructed in accordance with various embodiments to have a seed structure 232 with a magnetic buffer layer 234 and a non-magnetic seed layer 236. The use of CoTa alloy as the magnetic buffer layer 234 can make the seed structure 232 magnetic and, as such, part of the bottom NiFe leading shield 238 while the Ru seed layer 236 effectively decouples the buffer layer 234 from the magnetic stack 240 and specifically the IrMnCr AFM layer 242. The seed structure 232 can function in concert with the non-magnetic cap layer 244 and NiFe trailing shield 246 to ensure the FeCoB free layer 248 responds exclusively to selected data bits instead of errant magnetic fields.

The thickness of the CoTa buffer layer 234 can be tuned, in assorted embodiments, to increase the pinning field between the AFM and CoFe alloy pinned layer 250, which corresponds with a more stable fixed magnetization in the magnetic stack 240 and a greater sensing margin between the free 248 and pinned 250 layers across the MgO spacer layer 252. With the increased efficiency and sensing accuracy provided by the increased fixed magnetization stability, the pulse width of the magnetic element 230 can be retained during operation without increasing the practical SSS. In contrast, an exclusively non-magnetic seed structure, such as a single layer of Ru or Ta, can increase the SSS without mitigating the possibility of the AFM 242 coupling with the leading shield 238.

Figure 7:
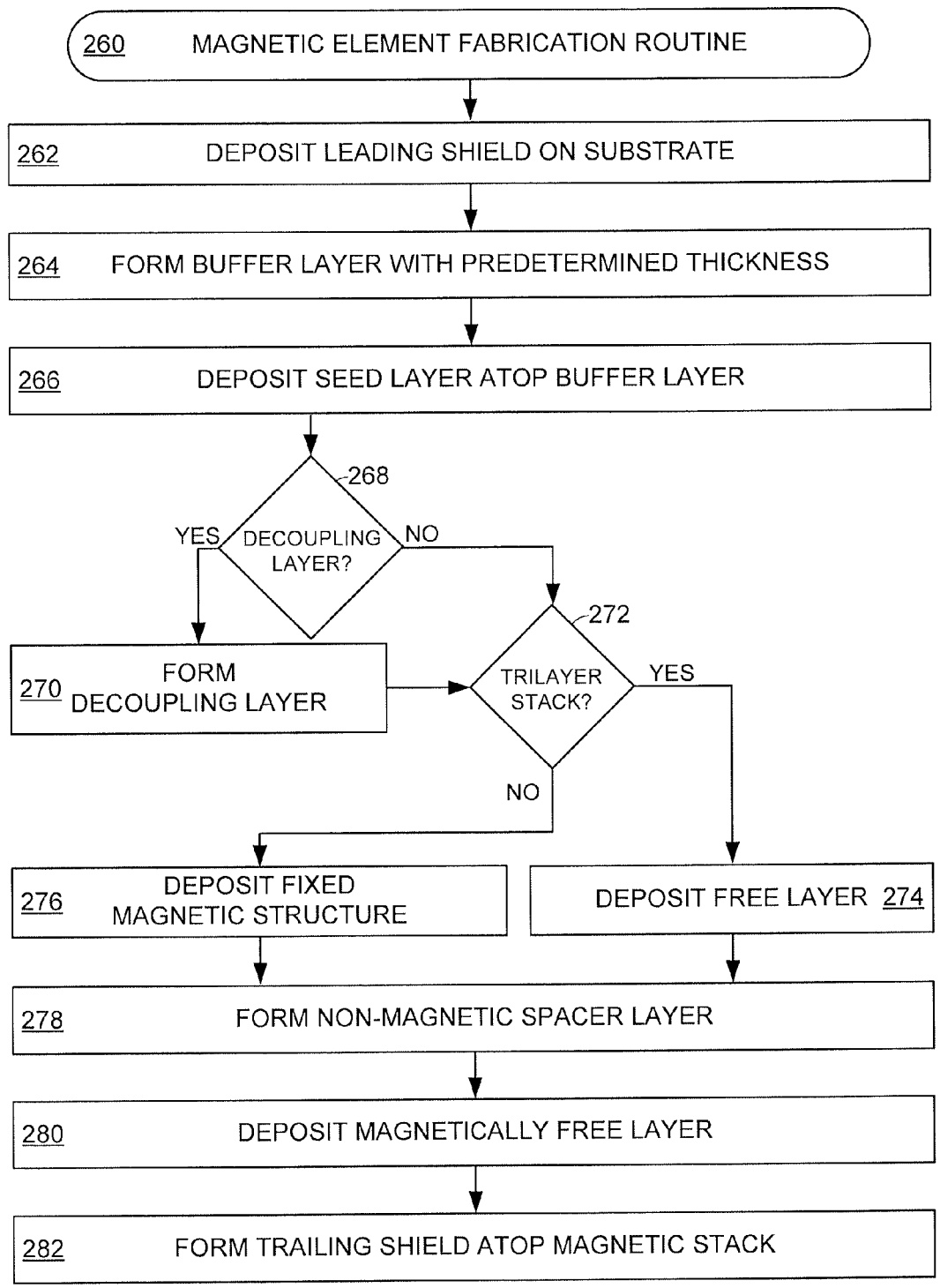
FIG. 7 provides an example magnetic element fabrication routine carried out in accordance with various embodiments.

The diverse variety of seed structure embodiments can be appreciated as providing tuned structure and magnetic operating characteristics for a magnetic stack that has a fixed magnetization structure, or doesn't. FIG. 7 portrays an example magnetic element fabrication routine 260 that can be carried out to create the diverse variety of seed structure and data sensing embodiments. Initially, routine 260 deposits a leading shield on a substrate in step 262. Such a leading shield is not limited to a particular material, configuration, and thickness and may be a lamination of dissimilar materials in assorted embodiments.

The leading shield can then be used as a substrate for a buffer layer formed in step 264 of a selected magnetic or non-magnetic material with a predetermined thickness. As shown in FIGS. 3B and 6, the buffer layer can be formed of a CoTa alloy that has a thickness corresponding to a magnetic stack pinning field and pinned layer coercivity. Although, the buffer layer formed in step 264 is not limited to CoTa as a variety of different alloys of Co and transition metals can be used at will to tune the structure and magnetic characteristics of a magnetic element. The buffer layer can next be used as a substrate by step 266 to deposit a magnetic or non-magnetic seed layer. Contrasting FIGS. 3B and 6 illustrate how the seed layer can be constructed as a NiFeW magnetic layer or a non-magnetic Ru layer that respectively provide different textures, magnetic properties, and thermal characteristics that can selectively accommodate a plethora of data storage environments.

The formation of a magnetic seed layer in step 266 may pose a risk of inadvertent coupling between the magnetic stack and the seed structure. While the buffer layer can mitigate such risk, decision 268 evaluates and determines if an decoupling layer is to be installed to further mitigate the chance of magnetic stack and seed layer coupling together. A choice to create a decoupling layer proceeds to step 270 where the decoupling layer is formed of a predetermined material, such as Ru, and thickness atop the seed layer. The formation of a decoupling layer or the choice of no decoupling layer from decision 268 advances routine 260 to decision 272 where the type of magnetic stack is determined.

If a trilayer stack is to be constructed after decision 272, step 274 deposits a free layer atop the existing seed structure. Alternatively, step 276 deposits a fixed magnetic structure, such as AFM and pinned layers, on the seed structure. Regardless of what type of magnetic stack is chosen from decision 272, step 278 forms a non-magnetic spacer layer of a selected material, such as MgO, on the fixed magnetic structure or free layer before step 280 deposits a magnetically free layer atop the spacer layer. The formation of the magnetic element then forms a trailing shield atop the magnetic stack to provide uptrack shielding of errant magnetic fields in concert with downtrack shielding provided by the leading shield formed in step 262.

Through the various steps and decisions of routine 260, a magnetic element can be configured to have assorted structural and operational characteristics. However, the steps and decisions of routine 260 are not required or limiting and can be changed, moved, and removed just as additional steps and decisions can be added at will. For example, a step may be added to construct a cap structure with a similar or dissimilar configuration as the seed structure, between the free layer formed in step 280 and the trailing shield. In another non-limiting example, additional shields, such as side shields, can be formed during or after the magnetic stack is formed.

With the tuned construction of a seed structure with a magnetic buffer layer disposed between a seed layer and a magnetic shield, coupling between the shield and seed layer can be promoted while mitigating coupling between an adjacent magnetic stack and the seed layer. The ability to tune the magnetic buffer layer for material and thickness can provide a seed structure that stabilizes the magnetic stack while decoupling the stack from the adjacent magnetic shield. Furthermore, the tuned magnetic buffer layer can be constructed and operated without adding to the SSS of the magnetic element, which allows the element to be used in data storage environments with high data bit areal densities and reduced form factors.

It is to be understood that even though numerous characteristics and configurations of various embodiments of the present disclosure have been set forth in the foregoing description, together with details of the structure and function of various embodiments, this detailed description is illustrative only, and changes may be made in detail, especially in matters of structure and arrangements of parts within the principles of the technology to the full extent indicated by the broad general meaning of the terms in which the appended claims are expressed. For example, the particular elements may vary depending on the particular application without departing from the spirit and scope of the present disclosure.

What is claimed is:

1. An apparatus comprising a seed lamination disposed between a magnetic stack and shield, the seed lamination comprising a coupling buffer layer, a decoupling layer, and a seed layer, the decoupling layer disposed between the magnetic stack and the magnetic seed layer, the coupling buffer layer contacting the shield and seed layer and comprising an alloy of cobalt and a transition metal.

2. The apparatus of claim 1, wherein the magnetic stack comprises a trilayer sensor having multiple magnetic free layers and lacking a fixed magnetization.

3. The apparatus of claim 1, wherein the magnetic stack comprises an abutted junction sensor having fixed and free magnetizations.

4. The apparatus of claim 1, wherein the shield is a leading shield.

5. The apparatus of claim 1, wherein the seed layer comprises NiFeW.

6. The apparatus of claim 1, wherein the seed layer is non-magnetic.

7. The apparatus of claim 1, wherein the seed layer contacts an antiferromagnetic layer and the coupling buffer layer.

8. The apparatus of claim 7, wherein the antiferromagnetic layer comprises IrMnCr.

9. The apparatus of claim 1, wherein the seed layer contacts a magnetically free layer and the coupling buffer layer.

10. A magnetic element comprising a seed lamination disposed between a magnetic stack and shield, the seed lamination comprising a coupling buffer layer decoupling layer, and a seed layer, the decoupling layer disposed between the magnetic stack and the seed layer, the coupling buffer layer contacting the magnetic shield and the magnetic seed layer contacting the magnetic stack, the coupling buffer layer disposed between the magnetic shield and magnetic seed layer and comprising a CoTa alloy material.

11. The magnetic element of claim 10, wherein the CoTa alloy material comprises $Co_X Ta_{1-X}$ where X is between 15-40 atomic %.

12. The magnetic element of claim 10, wherein a decoupling layer comprises a transition metal material.

13. The magnetic element of claim 12, wherein the decoupling layer comprises Ru.

14. The magnetic element of claim 10, wherein the coupling buffer layer is 15 Å thick as measured parallel to and on an air bearing surface.

15. The magnetic element of claim 10, wherein the CoTa alloy is amorphous.

16. A data reader comprising a seed lamination disposed between a magnetic stack and shield, the seed lamination comprising a coupling buffer layer, a decoupling layer, and a magnetic seed layer, the decoupling layer disposed between the magnetic stack and the magnetic seed layer, the magnetic stack comprising a reference lamination having a pinning material contacting the decoupling layer, the coupling buffer layer contacting the shield and seed layer and comprising an alloy of cobalt and a transition metal.

17. The data reader of claim 16, wherein the seed lamination promotes magnetic coupling between the magnetic shield and magnetic seed layer.

18. The data reader of claim 17, wherein the coupling buffer layer mitigates magnetic coupling between the pinning material and the magnetic seed layer.

19. The data reader of claim 16, wherein the coupling buffer layer corresponds with an exchange coupling between the pinning material and a pinned layer of the magnetic stack, the exchange coupling being less than −1150 Oe.

20. The data reader of claim 16, wherein the coupling buffer layer corresponds with a pinned layer magnetic coercivity of 520 Oe.

* * * * *